United States Patent
Kim et al.

(10) Patent No.: US 12,222,516 B2
(45) Date of Patent: Feb. 11, 2025

(54) PICTURE GENERATING UNIT FOR A HEAD-UP DISPLAY

(71) Applicant: HYUNDAI MOBIS CO., LTD., Seoul (KR)

(72) Inventors: Byung Ki Kim, Yongin-si (KR); Yu Jin Shin, Seongnam-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 18/396,921

(22) Filed: Dec. 27, 2023

(65) Prior Publication Data

US 2024/0302667 A1 Sep. 12, 2024

(30) Foreign Application Priority Data

Mar. 10, 2023 (KR) .................. 10-2023-0031543

(51) Int. Cl.
*G02B 27/01* (2006.01)
*H05K 1/02* (2006.01)

(52) U.S. Cl.
CPC ....... *G02B 27/0176* (2013.01); *H05K 1/0203* (2013.01); *G02B 2027/013* (2013.01); *H05K 2201/10106* (2013.01); *H05K 2201/10136* (2013.01)

(58) Field of Classification Search
CPC .......... G02B 27/1076; G02B 2027/013; H05K 1/0203; H05K 2201/10106; H05K 2201/10136
See application file for complete search history.

(56) References Cited

U.S. PATENT DOCUMENTS

| | | | |
|---|---|---|---|
| 7,095,562 B1 * | 8/2006 | Peng | G02B 27/0101 359/290 |
| 7,619,825 B1 * | 11/2009 | Peng | G02B 27/0101 359/630 |
| 2008/0278822 A1 * | 11/2008 | Choi | G02B 27/0101 359/630 |
| 2018/0231777 A1 * | 8/2018 | Yoon | B29D 11/00269 |
| 2018/0231780 A1 * | 8/2018 | Huang | G02B 27/0172 |
| 2018/0233860 A1 * | 8/2018 | Lin | H01R 13/665 |
| 2018/0235070 A1 * | 8/2018 | Brocklesby | G06F 1/20 |
| 2018/0235075 A1 * | 8/2018 | Gaines | H05K 1/0218 |
| 2019/0162959 A1 * | 5/2019 | Lee | G02B 27/18 |

* cited by examiner

*Primary Examiner* — Sejoon Ahn
(74) *Attorney, Agent, or Firm* — Morgan, Lewis & Bockius LLP

(57) ABSTRACT

A picture generating unit for a head-up display, the picture generating unit being coupled to a sidewall or a lower surface of a lower case of the head-up display, the picture generating unit comprising: a backlight unit configured to be coupled to both a one-mirror type head-up display and a two-mirror type head-up display.

8 Claims, 12 Drawing Sheets

PICTURE GENERATING UNIT FOR A HEAD-UP DISPLAY

TECHNICAL FIELD

The present disclosure relates to a common structure of a picture generating unit for a head-up display.

BACKGROUND

The contents described in this section merely provide background information related to the present disclosure and do not constitute prior art.

A conventional head-up display includes a one mirror type and a two mirror type. The one-mirror type head-up display has a light path from a picture generating unit to an aspherical mirror, a windshield, and a driver's field of view.

In the two-mirror type head-up display, a folding mirror is additionally provided between the picture generating unit and the aspherical mirror. Accordingly, the optical path of the one-mirror type head-up display and the optical path of the two-mirror type head-up display are different, and thus there is a problem in that an optical unit, such as the picture generating unit, cannot be shared.

Accordingly, optical units of the one-mirror type head-up display and the two-mirror type head-up display, for example, a heat sink and a picture generating unit mount, need to be manufactured separately, which increases manufacturing cost.

SUMMARY

In view of the above, one embodiment of the present disclosure provides a picture generating unit, for a head-up display, capable of being used in both a one-mirror type head-up display and a two-mirror type head-up display.

One embodiment of the present disclosure provides a picture generating unit, for a head-up display, which is capable of improving assembly of the picture generating unit and reducing manufacturing cost.

One embodiment of the present disclosure provides a picture generating unit, for a head-up display, which includes a backlight unit configured to be coupled to the head-up display disposed on the left or right side of a vehicle by using a heat sink having a symmetrical structure.

One embodiment of the present disclosure provides a picture generating unit, for a head-up display, which is capable of preventing misassembly of a funnel reflector that can be coupled to both the one-mirror type head-up display and the two-mirror type head-up display based on an erroneous assembly prevention structure formed on the funnel reflector.

One embodiment of the present disclosure provides a picture generating unit, for a head-up display, which is capable of reducing manufacturing cost by reducing the number of process units by forming a LCD seating portion on a lower case.

The objects to be achieved by the present disclosure are not limited to the objects mentioned above, and other objects not mentioned will be clearly understood by those skilled in the art from the description below.

According to one embodiment of the present disclosure, the picture generating unit for the head-up display can be used in both the one-mirror type head-up display and the two-mirror type head-up display.

In the picture generating unit for the head-up display according to one embodiment of the present disclosure, assembly of the picture generating unit can be improved and the manufacturing cost thereof can be reduced.

According to one embodiment of the present disclosure, the picture generating unit for the head-up display can provide the backlight unit that is coupled to the head-up display disposed on the left or right side of a vehicle by using the heat sink having the symmetrical structure.

In the picture generating unit for the head-up display according to one embodiment of the present disclosure, it is possible to prevent misassembly of the funnel reflector that can be coupled to both the one-mirror type head-up display and the two-mirror type head-up display based on the erroneous assembly prevention structure formed on the funnel reflector.

In the picture generating unit for the head-up display according to one embodiment of the present disclosure, it is possible to reduce manufacturing cost by reducing the number of process units by forming the LCD seating portion on the lower case.

DETAILED DESCRIPTIONS

Figure 1:
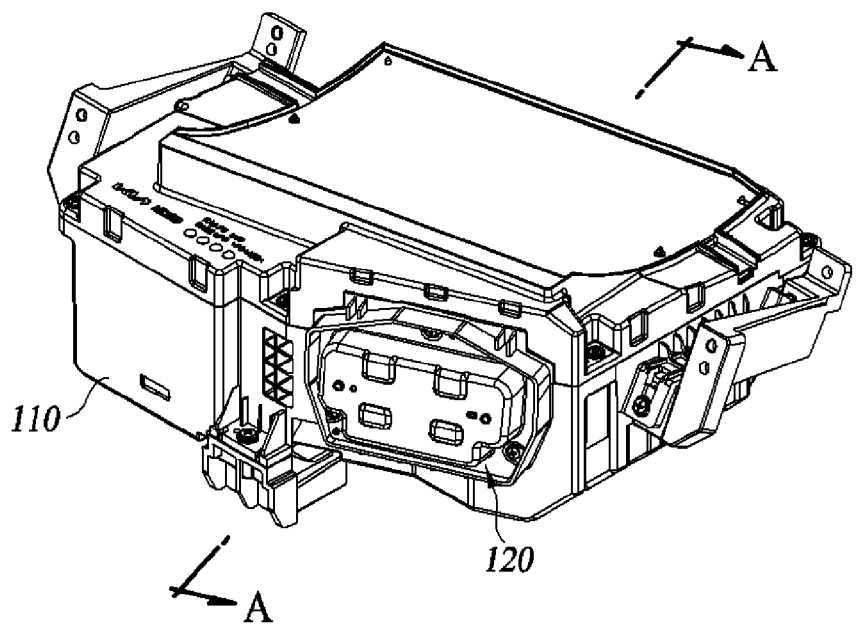
FIG. 1 is a perspective view illustrating a configuration of a one-mirror type head-up display according to one embodiment of the present disclosure.

FIG. 1 is a perspective view illustrating a configuration of a one-mirror type head-up display according to one embodiment of the present disclosure.

Referring to FIG. 1, the one-mirror type head-up display 100 may include a lower case 110 and a picture generating unit 120. In this case, the picture generating unit 120 may be coupled to a sidewall of the lower case 110.

Figure 2A:
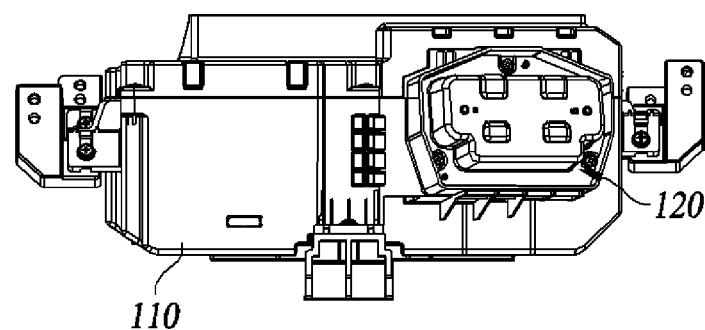
FIG. 2A is a view illustrating a state in which a picture generating unit is coupled to the one-mirror type head-up display according to one embodiment of the present disclosure when the one-mirror type head-up display is disposed on the left side of a vehicle.

FIG. 2A is a view illustrating a state in which the picture generating unit is coupled to the one-mirror type head-up display according to one embodiment of the present disclosure when the one-mirror type head-up display is disposed on the left side of a vehicle.

Figure 2B:
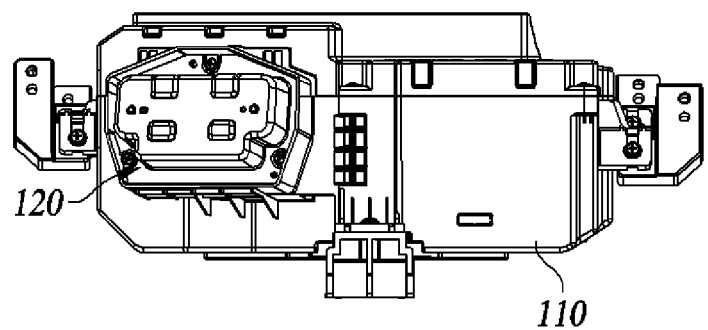
FIG. 2B is a view illustrating a state in which a picture generating unit is coupled to the one-mirror type head-up display according to one embodiment of the present disclosure when the one-mirror type head-up display is disposed on the right side of the vehicle.

FIG. 2B is a view illustrating a state in which the picture generating unit is coupled to the one-mirror type head-up display according to one embodiment of the present disclosure when the one-mirror type head-up display is disposed on the right side of the vehicle.

Referring to FIG. 2A and FIG. 2B, the one-mirror type head-up display 100 may be disposed on the left or right side of the vehicle. In this case, the left side of the vehicle refers to a driver's seat, and the right side refers to a passenger's seat. Accordingly, depending on whether the one-mirror type head-up display 100 is disposed on the left or right side of the vehicle, the position at which the picture generating unit 120 is coupled to the lower case 110 is different. The picture generating unit 120 according to one embodiment of the present disclosure is formed in such a way that it can be used even when the one-mirror type head-up display 100 is disposed on the left or right side of the vehicle.

Figure 3:
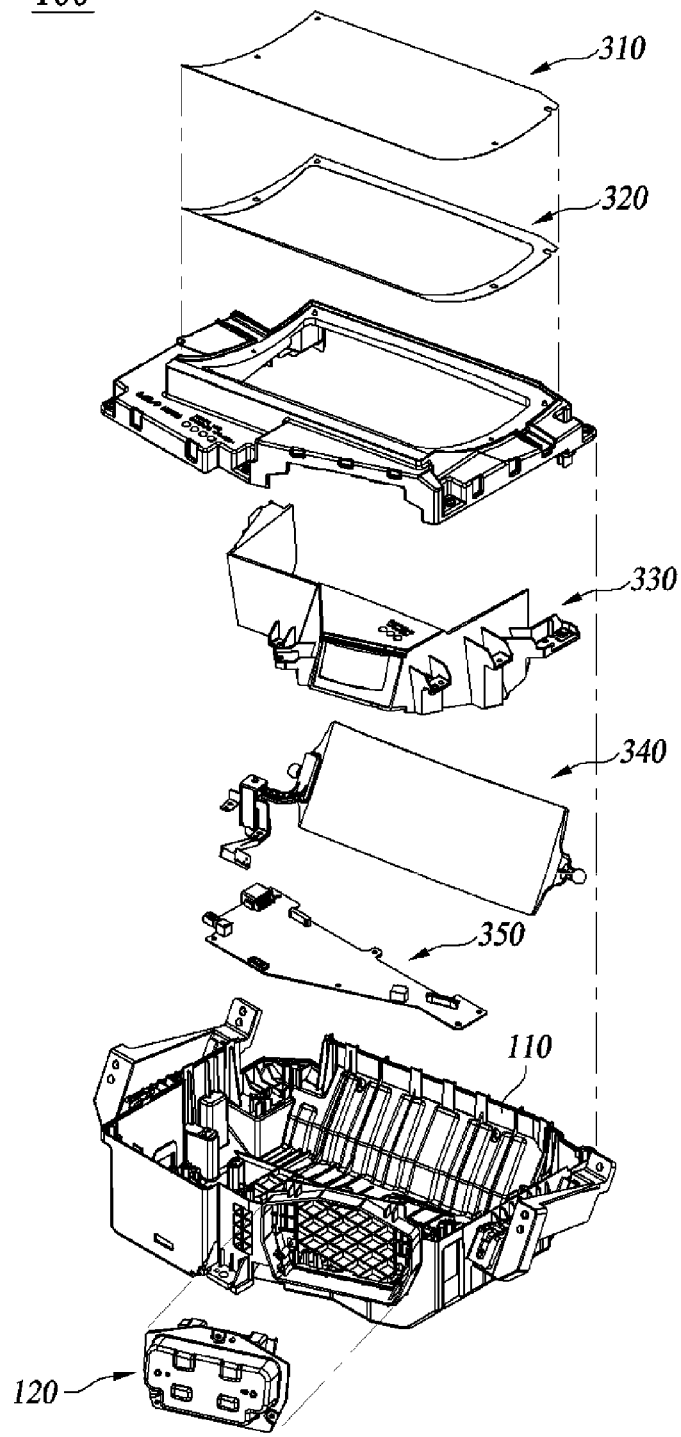
FIG. 3 is an exploded perspective view illustrating a configuration of the one-mirror type head-up display according to one embodiment of the present disclosure.

FIG. 3 is an exploded perspective view illustrating a configuration of the one-mirror type head-up display according to one embodiment of the present disclosure.

Figure 4:
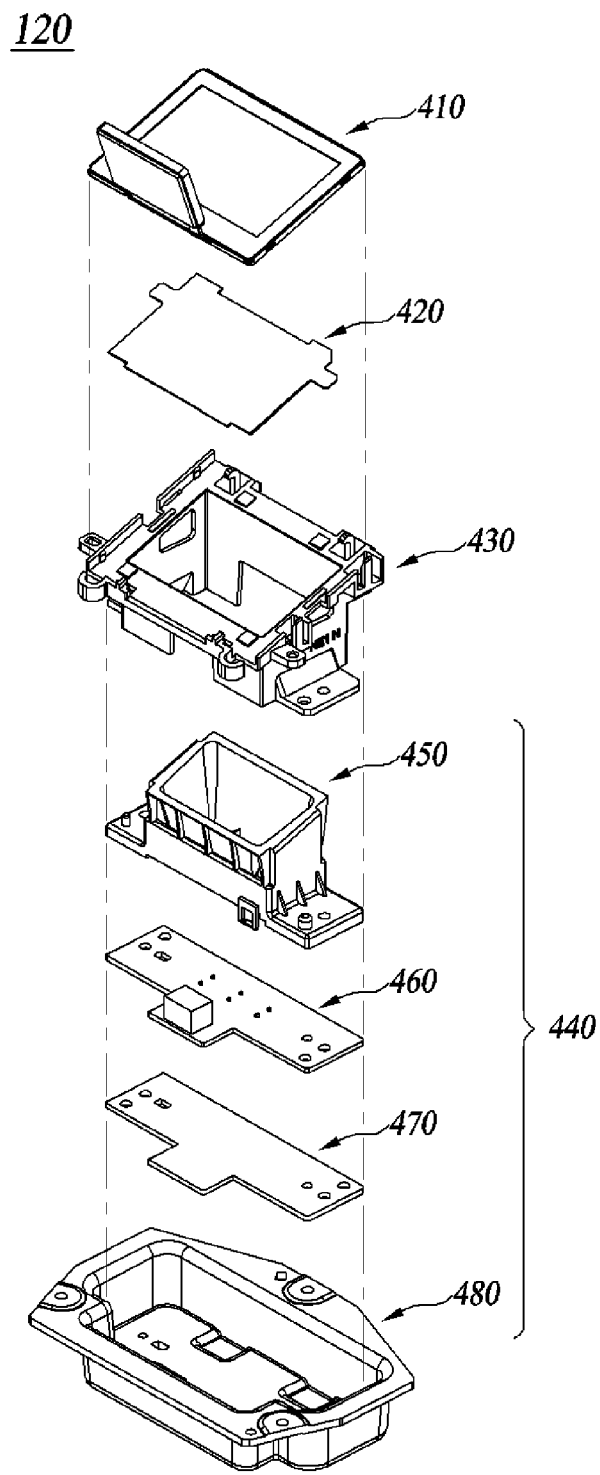
FIG. 4 is an exploded perspective view illustrating the picture generating unit of FIG. 3 in detail.

FIG. 4 is an exploded perspective view illustrating the picture generating unit of FIG. 3 in detail.

Referring to FIGS. 3 and 4, the one-mirror type head-up display 100 includes all or some of a cover lens assembly 310, an upper case 320, a screen 330, an aspherical mirror 340, a main printed circuit board (PCB) 350, a lower case 110, and a picture generating unit 120.

The cover lens assembly 310 is coupled to a front side of the upper case 320.

The screen 330 may be coupled to an upper portion of the aspherical mirror 340. The screen 330 may be coupled to the lower case 110 to restrict linear motion of the aspherical mirror 340 in at least one direction.

The aspherical mirror 340 may include spherical mounts (not shown) at both ends to be coupled to the lower case 110 so as to be rotatable. An image including driving information of the vehicle generated by the picture generating unit 120 may be reflected by the aspherical mirror 340 and displayed on a windshield (not shown).

The picture generating unit 120 includes all or some of a liquid crystal display (LCD) 410, a diffuser 420, an LCD cover 430, and a back light unit 440.

The LCD 410 generates driving information of the vehicle.

The diffuser 420 is disposed between the LCD 410 and the LCD cover 430. The diffuser 420 disperses light emitted from the back light unit 440 so that the light is evenly incident on a rear side of the LCD 410.

The LCD cover 430 is disposed between the LCD 410 and the backlight unit 440. The LCD cover 430 may be snap-fitted to the LCD 410 using a mating surface (not shown) that is inclined by a predetermined angle.

The backlight unit 440 includes a funnel reflector 450, an LED PCB 460, a thermal grease 470, and a heat sink 480.

The backlight unit 440 irradiates light generated from a plurality of light sources disposed on the LED PCB 460 to the LCD 410 via the LCD cover 430.

The funnel reflector 450 may be disposed on the front side of the LED PCB 460 where a light source is disposed. The funnel reflector 450 may be disposed on the rear side of the LCD 410 and the diffuser 420. The funnel reflector 450 guides a traveling path of light so that light emitted from the light source is uniformly incident on the diffuser 420 and the LCD 410. The interior of the funnel reflector 450 may form a cup-shaped optical surface to guide the traveling path of light emitted from the light source.

The LED PCB 460 includes a plurality of light sources (not shown). In this case, the light source is a member that emits light. The light source may be a light emitting diode (LED). The plurality of light sources may be disposed in a predetermined pattern on the LED PCB 460.

The thermal grease 470 is disposed at the rear side of LED PCB 460. The thermal grease 470 may be a heat-resistant adhesive material.

The heat sink 480 dissipates heat generated inside the backlight unit 440. The heat sink 480 is coupled to the lower case 110 with bolts and nuts.

Figure 5:
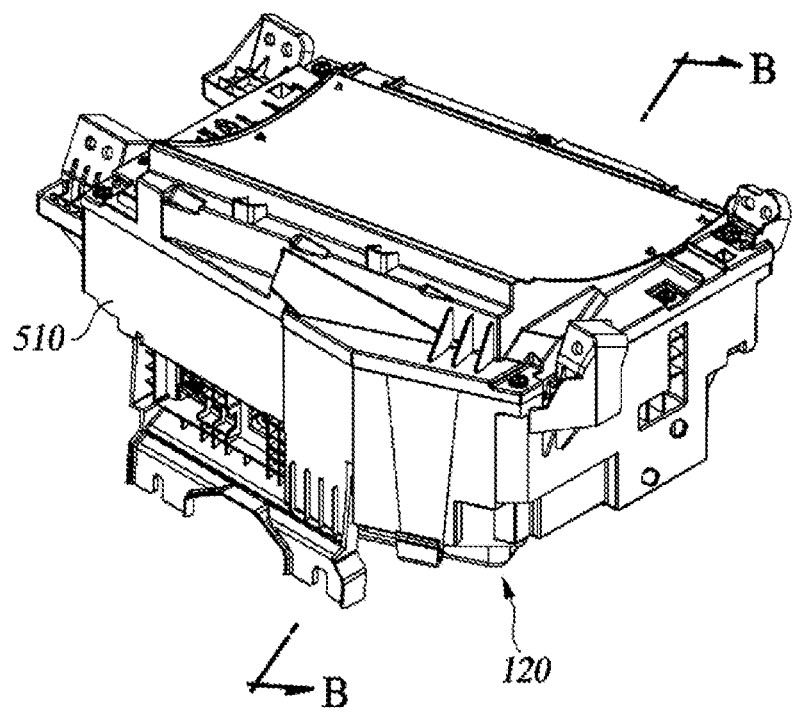
FIG. 5 is a perspective view illustrating a configuration of a two-mirror type head-up display according to another embodiment of the present disclosure.

FIG. 5 is a perspective view illustrating a configuration of a two-mirror type head-up display according to another embodiment of the present disclosure.

Figure 6A:
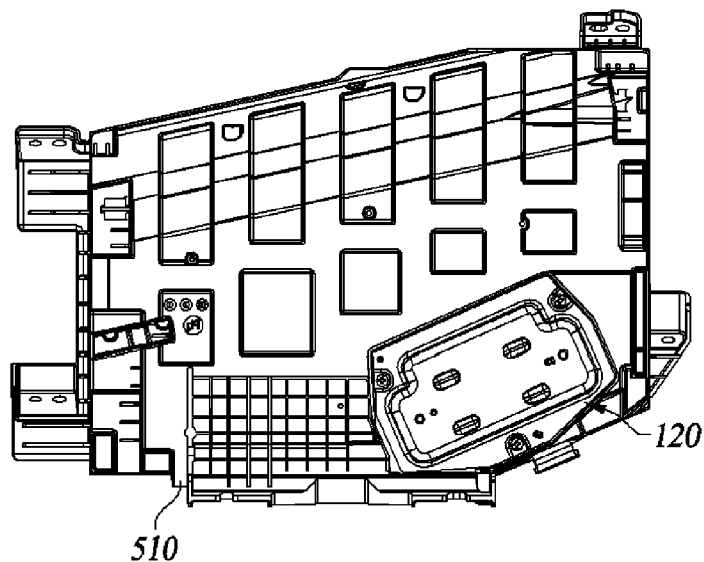
FIG. 6A is a view illustrating a state in which the picture generating unit is coupled to the two-mirror type head-up display according to another embodiment of the present disclosure when the two-mirror type head-up display is disposed on the left side of a vehicle.

FIG. 6A is a view illustrating a state in which the picture generating unit is coupled to the two-mirror type head-up display according to another embodiment of the present disclosure when the two-mirror type head-up display is disposed on the left side of a vehicle.

Figure 6B:
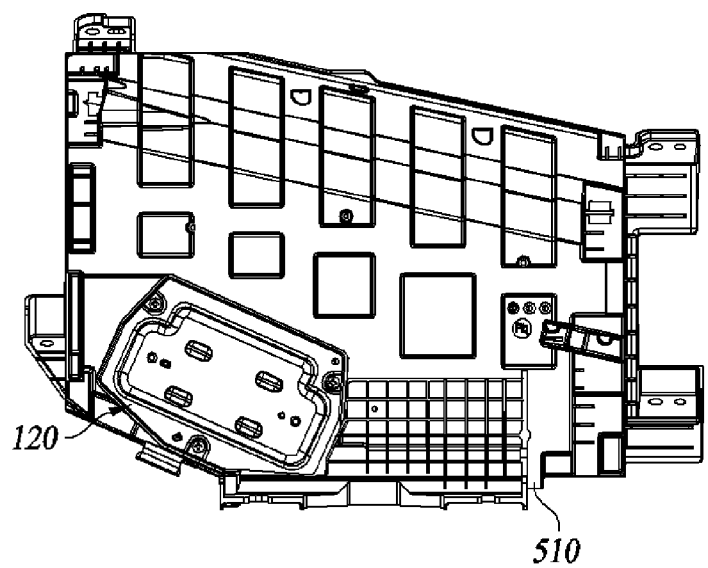
FIG. 6B is a view illustrating a state in which the picture generating unit is coupled to the two-mirror type head-up display according to another embodiment of the present disclosure when the two-mirror type head-up display is disposed on the right side of the vehicle.

FIG. 6B is a view illustrating a state in which the picture generating unit is coupled to the two-mirror type head-up display according to another embodiment of the present disclosure when the two-mirror type head-up display is disposed on the right side of the vehicle.

Referring to FIG. 5, FIG. 6A and FIG. 6B, the two-mirror type head-up display 500 includes a lower case 510 and a picture generating unit 120. In this case, the picture generating unit 120 may be coupled to a lower surface of the lower case 510. The two-mirror type head-up display 500 may also be disposed on the left or right side of the vehicle, similarly to the one-mirror type head-up display 100. Thus, depending on whether the two-mirror type head-up display 500 is disposed on the left or right side of the vehicle, the position at which the picture generating unit 120 is coupled to the lower case 510 is different.

Figure 7:
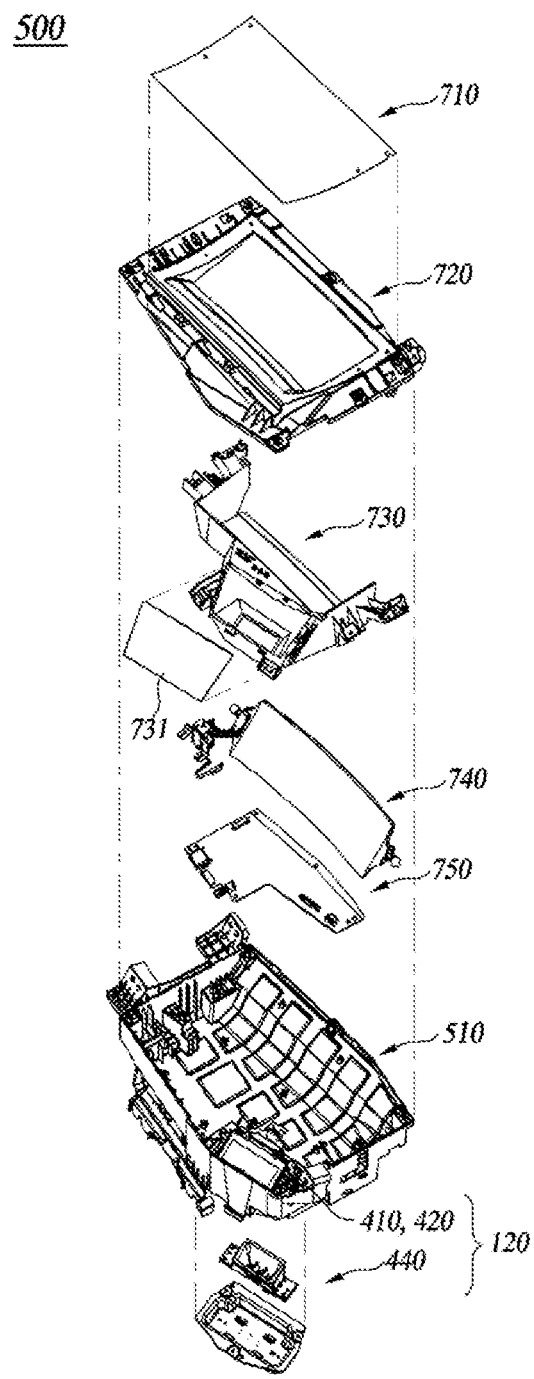
FIG. 7 is an exploded perspective view illustrating a configuration of the two-mirror type head-up display according to another embodiment of the present disclosure.

FIG. 7 is an exploded perspective view illustrating a configuration of the two-mirror type head-up display according to another embodiment of the present disclosure.

Figure 8:
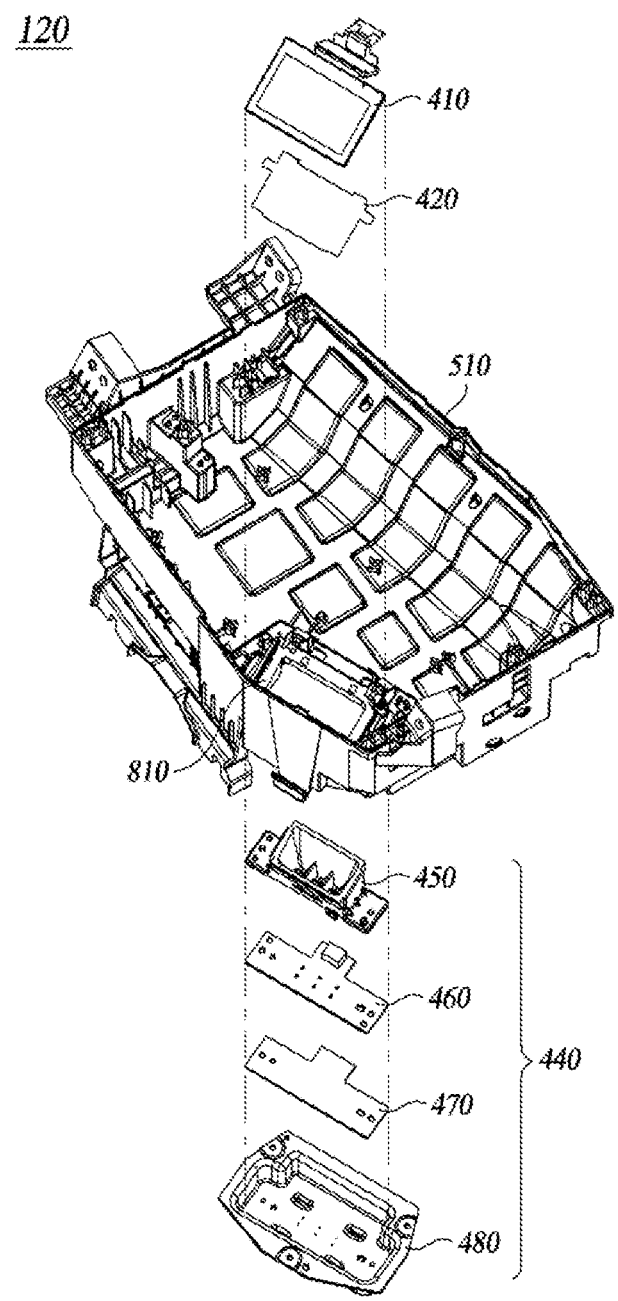
FIG. 8 is an exploded perspective view illustrating the picture generating unit of FIG. 7 in detail.

FIG. 8 is an exploded perspective view illustrating the picture generating unit of FIG. 7 in detail.

In the following description of the configuration of the two-mirror type head-up display 500, redundant description of the contents overlapping with the configuration of the one-mirror type head-up display 100 described above will be omitted and the differences will be described.

Referring to FIGS. 7 and 8, the two-mirror type head-up display 500 includes all or some of a cover lens assembly 710, an upper case 720, a screen 730, an aspherical mirror 740, an main PCB 750, a lower case 510, and the picture generating unit 120.

The two-mirror type head-up display 500 further includes a folding mirror 731. The folding mirror 731 is disposed on a light path formed inside the screen 730. Thus, light generated by the LED PCB 460 is reflected by the folding mirror 731 via the LCD 410.

The picture generating unit 120, according to another embodiment of the present disclosure, further includes an LCD seating portion 810 on which the LCD 410 is mounted. The LCD seating portion 810 may be formed at one side of the lower case 510. Thus, the LCD 410 and the diffuser 420 may be snap-fitted to the LCD seating portion 810 formed in the lower case 510. Additionally, the backlight unit 440 may be coupled to the rear side of the LCD seating portion 810. In this case, the front side and the rear side are described relative to the path along which light generated by the LED PCB 460 is irradiated toward the LCD 410.

According to one embodiment and another embodiment of the present disclosure, the backlight unit 440 may be coupled to both the one-mirror type head-up display 100 and the two-mirror type head-up display 500.

Figure 9A:
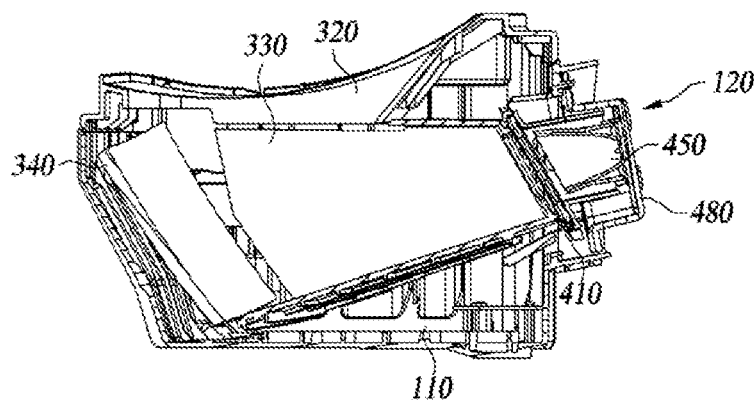
FIG. 9A is a cross-sectional view taken along line A-A of FIG. 1, which is viewed from the left side.

FIG. 9A is a cross-sectional view taken along line A-A of FIG. 1, which is viewed from the left side.

Figure 9B:
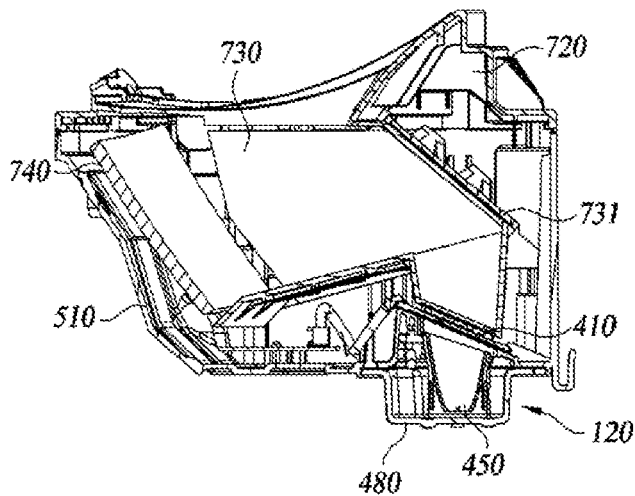
FIG. 9B is a cross-sectional view taken along line B-B of FIG. 5, which is viewed from the left side.

FIG. 9B is a cross-sectional view taken along line B-B of FIG. 5, which is viewed from the left side.

Referring to FIGS. 9A and 9B, the one-mirror type head-up display 100 has a single mirror disposed therein. In this case, the single mirror may be an aspherical mirror 340. Accordingly, in the one-mirror type head-up display 100, the picture generating unit 120 is preferably coupled to a side surface of the lower case 110. The LCD 410, which is disposed at the same angle as an upper end surface of the funnel reflector 450, is tilted by a predetermined angle to irradiate display image onto the aspherical mirror 340.

The two-mirror type head-up display 500 has two mirrors disposed therein. The two mirrors may be the folding mirror 731 and the aspherical mirror 740. In the two-mirror type head-up display 500, the picture generating unit 120 is coupled to the lower surface of the lower case 510. The LCD 410, which is disposed at the same angle as the upper end surface of the funnel reflector 450, is tilted by a predetermined angle to irradiate display image onto the folding mirror 731. The display image may be reflected by the folding mirror 731 to be irradiated toward the aspherical mirror 740. Accordingly, the angle of the LCD 410 coupled to the one-mirror type head-up display 100 and the angle of the LCD 410 coupled to the two-mirror type head-up display 500 are different. The angle difference between the LCD 410 coupled to the one-mirror type head-up display 100 and the LCD 410 coupled to the two-mirror type head-up display 500 may be, for example, 180°. Accordingly, when the funnel reflector 450 is coupled to the heat sink 480 of the one-mirror type head-up display 100 in a forward orientation, the funnel reflector 450 may be rotated, e.g., 180° to be coupled to the heat sink 480 of the two-mirror type head-up display 500. By coupling the funnel reflector 450 to the picture generating unit 120 in the forward or reverse orientation, the backlight unit 440 may be coupled to both the one-mirror type head-up display 100 and the two-mirror type head-up display 500.

Figure 10:
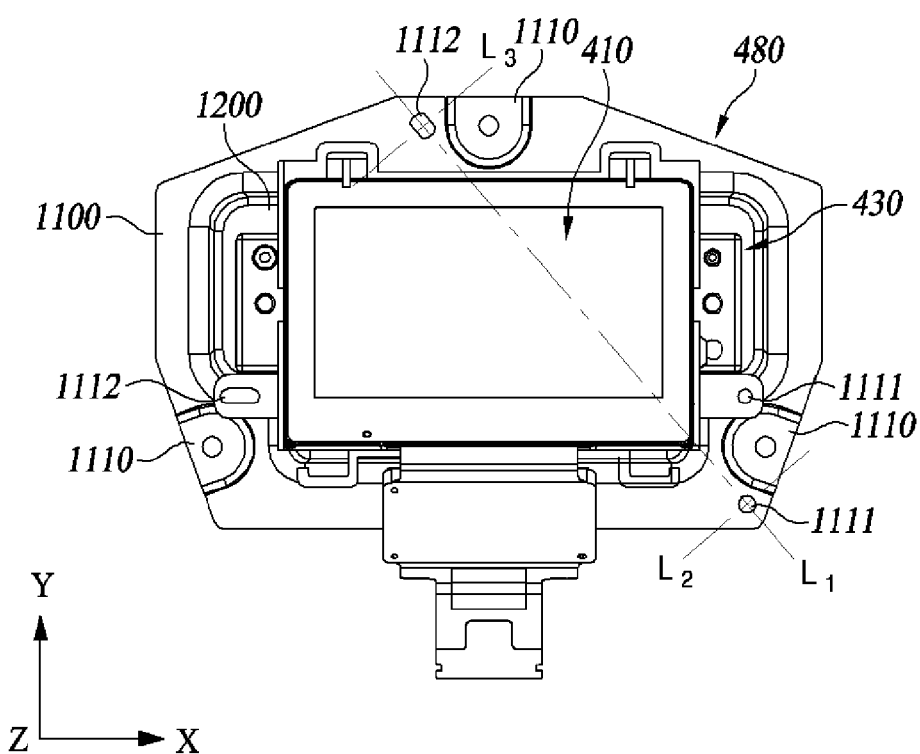
FIG. 10 is a plan view illustrating the picture generating unit according to one embodiment of the present disclosure.
Figure 11:
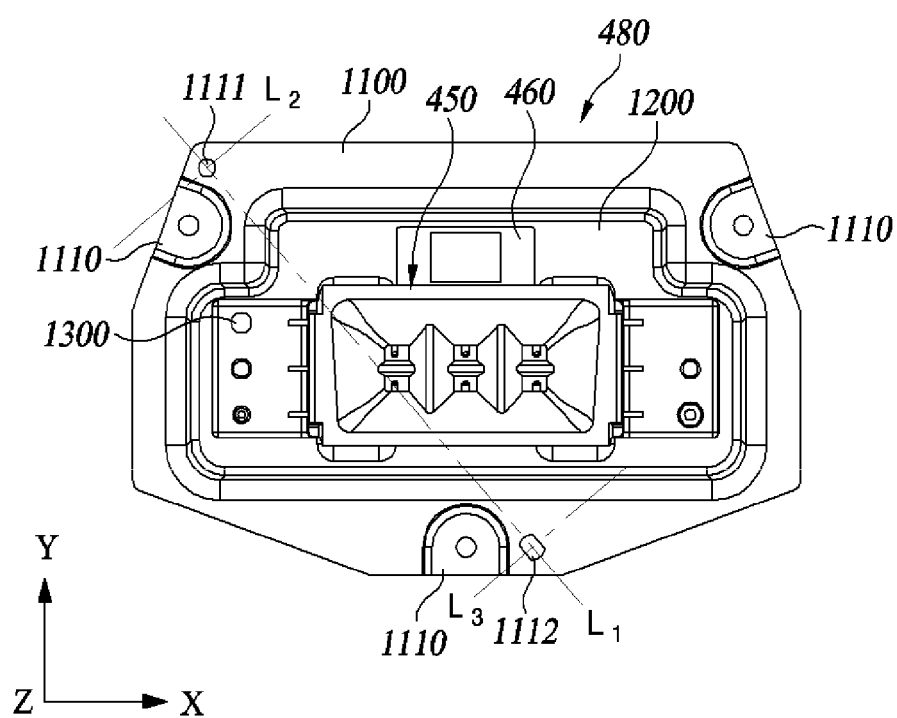
FIG. 11 is a plan view illustrating a backlight unit according to another embodiment of the present disclosure.

FIG. 10 is a plan view illustrating the picture generating unit according to one embodiment of the present disclosure.

Referring to FIG. 10, the heat sink 480 is coupled to an lower end of the funnel reflector 450. The heat sink 480 includes a flange portion 1100 and an accommodation portion 1200.

The flange portion 1100 has a polygonal cross-sectional shape. For example, the flange portion 1100 may have eight corners. Additionally, the flange portion 1100 has a symmetrical shape structure. For example, the flange portion 1100 may have a symmetrical shape in which the left and right sides are identical with respect to an imaginary center line perpendicular to a longitudinal direction.

The accommodation portion 1200 forms an accommodation space that accommodates the funnel reflector 450 and the LED PCB 460. The accommodation portion 1200 may accommodate all or some of the LED PCB 460, the funnel reflector 450, and the LCD cover 430.

The flange portion 1100 may include a first locator 1110, a second locator 1111, and a third locator 1112. The heat sink 480 is coupled to a sidewall or a lower surface of the lower case 110 or 510. Thus, the first locator 1110, the second locator 1111, and the third locator 1112 may be coupled to blocks (not shown) formed in the lower case 110 and 510 to determine the position of the picture generating unit 120 and the backlight unit 440. In this case, the first locator 1110 and the second locator 1111 may be holes.

Unlike a workpiece, which is typically positioned using six independent blocks, for example, locators, a sheet panel may be positioned using a combination of blocks, pins and the like. The first locator 1110, the second locator 1111, and the third locator 1112 form a 4-2-1 positioning. The second locator 1111 restricts movement in two orthogonal directions, for example, four directions, and the third locator 1112 restricts movement in one orthogonal direction, for example, two directions. Thus, according to one embodiment and another embodiment of the present disclosure, in the one-mirror type head-up display 100 and the two-mirror type head-up display 500, the picture generating unit 120 can be coupled to the head-up display based on a 4-2-1 positioning method using the configuration of the first locator 1110, the second locator 1111, and the third locator 1112 when determining the position of the picture generating unit 120 and the backlight unit 440.

The number of the first locators 1110 may be at least three. The first locators 1110 are formed at a center, a left side, and a right side of the flange portion 1100. In this case, at least one of the first locators 1110 is disposed in the center of the flange 1100, and two first locators are disposed on the flange 1100 symmetrically with respect to the at least one first locator disposed at the center. The first locator 1100 forms a face that protrudes in the z-axis direction by a predetermined height. An area of the protruding first locator 1100 may be an area that can generate sufficient coupling force when the picture generating unit 120 and the backlight unit 440 are coupled to the lower case 110 or 510. A hole is formed in a central portion of the first locator 1110. The hole formed in the first locator 1110 is coupled to a boss formed in the lower case 110 or 510. Accordingly, the first locator 1110 may restrict linear motion of the picture generating unit 120 in at least one direction. For example, the first locator 1110 may restrict linear motion of the picture generating unit 120 in the z-axis.

The LCD cover 430 may include at least one second locator 1111 and at least one third locator 1112. The one-mirror type head-up display 100 according to one embodiment of the present disclosure, when coupled with the picture generating unit 120, may be coupled with the first locator 1100 formed on the heat sink 480 and simultaneously coupled with the second locator 1111 and the third locator 1112 formed on the LCD cover 430.

The position of the picture generating unit 120 can be determined using the first locator 1100, the second locator 1111, and the third locator 1112. The second locator 1111 may restrict the linear motion of the picture generating unit 120 in at least four directions. For example, in the picture generating unit 120 coupled to the one-mirror type head-up display 100 according to one embodiment of the present disclosure, the linear motion of the picture generating unit 120 in the x-axis, −x-axis, y-axis, and −y-axis directions can be restricted by the second locator 1111 formed on the LCD cover 430. The third locator 1112 formed on the LCD cover 430 restricts the linear motion of the picture generating unit 120 in at least two directions. For example, the third locator 1112 can restrict the linear motion of the picture generating unit 120 in the y-axis and −y-axis directions.

In addition, the position of the picture generating unit 120 coupled to the one-mirror type head-up display 100 according to one embodiment of the present disclosure may be determined using the second locator 1111 and the third locator 1112 formed on the flange portion 1100. When the position of the picture generating unit 120 is determined using the second locator 1111 and the third locator 1112 formed on the heat sink 480, the second locator 1111 formed on the heat sink 480 restricts the linear motion of the picture generating unit 120 corresponding to imaginary straight lines L1 and L2. Further, the third locator 1112 formed on the heat sink 480 restricts the linear motion of the picture generating unit 120 corresponding to an imaginary straight line L3.

When the LCD seating portion 810 is formed in the lower case 510 based on the above descriptions, the backlight unit 440 is coupled to the rear side of the LCD seating portion 810. The heat sink 480 of the backlight unit 440 may be coupled to the lower case 510. In this case, the position of the backlight unit 440 is determined using the first locator 1110, the third locator 1111, and the second locator 1112 formed on the heat sink 480, and the linear motion of the backlight unit 440 in six directions, for example, may be restricted.

The backlight unit 440 according to another embodiment of the present disclosure may vary the angle of the picture generating unit 120 by changing the positions of the second locator 1111 and the third locator 1112. Accordingly, the angle of the picture generating unit 120 can be varied to be used in various vehicle types.

Figure 12:
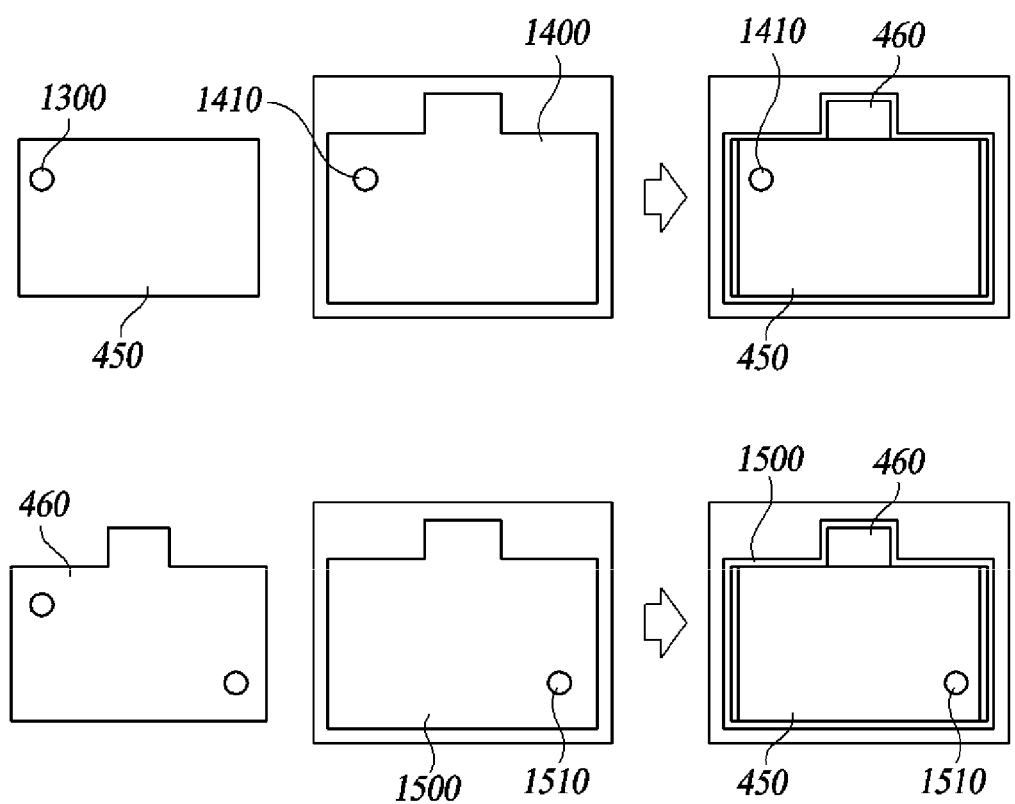
FIG. 12 is a view illustrating an erroneous assembly prevention structure for preventing misassembly of a funnel reflector that can be coupled to both the one-mirror type head-up display and the two-mirror type head-up display.

FIG. 12 is a view illustrating an erroneous assembly prevention structure for preventing misassembly of a funnel reflector that can be coupled to both the one-mirror type head-up display and the two-mirror type head-up display.

Referring to FIG. 12, when coupled to the one-mirror type head-up display 100 or the two-mirror type head-up display 500, the funnel reflector 450 is coupled in a forward or reverse orientation depending on the angle of the LCD 410. Accordingly, to prevent misassembly in the assembly process of the picture generating unit 120 and the backlight unit 440, the funnel reflector 450 may include an erroneous assembly prevention hole 1300. The erroneous assembly prevention hole 1300 may be formed in one corner of a lower surface of the funnel reflector 450.

For example, when the funnel reflector 450 and the LED PCB 460 are coupled to the one-mirror type head-up display 100, the funnel reflector 450 is coupled to the LED PCB 460 in the forward orientation. Accordingly, the funnel reflector 450 is coupled with a forward boss 1410 on a forward jig 1400. The position of the forward boss 1410 corresponds to the position of the erroneous assembly prevention hole 1300 when the funnel reflector 450 is coupled in the forward orientation.

When the funnel reflector 450 and the LED PCB 750 are coupled to the two-mirror type head-up display 500, the funnel reflector 450 is coupled in the reverse orientation, that is, in a state in which the funnel reflector 450 is rotated 180° with respect to the forward orientation described above. Accordingly, the funnel reflector 450 is coupled with a reverse boss 1510 on a reverse jig 1500. In this case, the reverse boss 1510 is formed at a corner on the reverse jig 1500 diagonally opposite to the forward boss 1410. Thus, the erroneous assembly prevention hole 1300 is coupled to the reverse boss 1510, and the funnel reflector 450 is coupled in the 180° rotated state. In this case, the LED PCB 750 includes two holes (not shown) corresponding to the positions of the forward boss 1410 and the reverse boss 1510.

Accordingly, the misassembly of the funnel reflector 450 can be prevented by utilizing the erroneous assembly prevention hole 1300 that is coupled to the forward boss 1410 or the reverse boss 1510 depending on the one-mirror type head-up display 100 and the two-mirror type head-up display 500.

What is claimed is:

1. A picture generating unit for a head-up display, the picture generating unit being coupled to a sidewall or a lower surface of a lower case of the head-up display, the picture generating unit comprising:
    a backlight unit configured to be coupled to a one-mirror type head-up display or a two-mirror type head-up display, wherein the backlight unit includes:
        an LED PCB including a plurality of light sources;
        a funnel reflector configured to condense light emitted from the LED PCB toward an LCD;
        an LCD cover disposed between the LCD and the funnel reflector and snap-fitted to the LCD; and
    a heat sink including an accommodation portion that is configured to accommodate at least some of the funnel reflector, the LED PCB, and the LCD cover, and a flange portion coupled to the lower case.

2. The picture generating unit of claim 1, wherein the flange portion has a symmetrical shape structure.

3. The picture generating unit of claim 2, wherein the flange portion include:
    at least one first locator forming a face protruded in a z-direction by a predetermined height on the flange portion and configured to restrict linear motion of the picture generating unit in at least one direction;
    a second locator configured to restrict linear motion of the picture generating unit in at least four directions; and
    a third locator configured to restrict linear motion of the picture generating unit in at least two directions.

4. The picture generating unit of claim 1, wherein the funnel reflector has an erroneous assembly prevention structure configured to prevent misassembly between the one-mirror type head-up display and the two-mirror type head-up display.

5. The picture generating unit of claim 4, wherein the erroneous assembly prevention structure includes an erroneous assembly prevention hole formed at a corner of a lower surface of the funnel reflector.

6. The picture generating unit of claim 5, wherein the erroneous assembly prevention hole is coupled to a forward boss formed on a forward jig when the picture generating unit is coupled to the one-mirror type head-up display, and is coupled to a reverse boss formed on a reverse jig when the picture generating unit is coupled to the two-mirror type head-up display.

7. The picture generating unit of claim 6, wherein the funnel reflector is coupled to the accommodation portion in a forward orientation or in a reverse orientation rotated 180° with respect to the forward orientation, thereby allowing the picture generating unit to be used in both the one-mirror type head-up display and the two-mirror type head-up display.

8. The picture generating unit of claim 1, wherein the LCD cover includes an LCD seating portion in which the LCD is seated, and the LCD seating portion is formed at a predetermined angle on the sidewall or the lower surface of the lower case.

* * * * *